(12) United States Patent
Nakabayashi (10) Patent No.: US 6,461,938 B2
(45) Date of Patent: Oct. 8, 2002

(54) METHOD OF PRODUCING SEMICONDUCTOR DEVICES

(75) Inventor: Masakazu Nakabayashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/741,081

(22) Filed: Dec. 21, 2000

(65) Prior Publication Data

US 2001/0001078 A1 May 10, 2001

Related U.S. Application Data

(62) Division of application No. 09/287,105, filed on Apr. 7, 1999, now Pat. No. 6,215,194.

(30) Foreign Application Priority Data

Oct. 1, 1998 (JP) .......................................... 10-280172

(51) Int. Cl.$^7$ ............................................. H01L 21/46
(52) U.S. Cl. ........................................ 438/458; 438/464
(58) Field of Search ............................... 438/455, 458, 438/462, 464

(56) References Cited

U.S. PATENT DOCUMENTS

| 4,872,825 A | 10/1989 | Ross ........................... 425/117 |
| 4,933,744 A | 6/1990 | Segawa et al. ................ 357/72 |
| 5,178,957 A | 1/1993 | Kolpe et al. ................. 428/458 |
| 5,497,033 A | 3/1996 | Fillion et al. ............... 257/723 |
| 5,685,885 A | 11/1997 | Khandros et al. .............. 29/841 |
| 5,730,992 A | 3/1998 | Babb et al. .................. 264/258 |
| 5,747,101 A | 5/1998 | Booth et al. .................. 427/96 |
| 5,766,979 A | 6/1998 | Budnaitis ..................... 438/15 |
| 5,848,467 A | 12/1998 | Khandros et al. .............. 29/841 |
| 5,882,956 A * | 3/1999 | Umehara ..................... 438/114 |
| 5,958,995 A | 9/1999 | Narang et al. ................. 522/35 |
| 5,962,608 A | 10/1999 | Ryang et al. .................. 526/89 |
| 5,971,253 A | 10/1999 | Gilleo et al. ........... 228/180.22 |
| 6,007,407 A | 12/1999 | Rutherford et al. ........... 451/41 |
| 6,042,922 A * | 3/2000 | Senoo ........................ 428/66.6 |
| 6,165,815 A * | 12/2000 | Ball ........................... 438/114 |
| 6,215,194 B1 * | 4/2001 | Nakabayashi ................ 257/782 |
| 6,245,646 B1 * | 6/2001 | Roberts ....................... 438/464 |

FOREIGN PATENT DOCUMENTS

JP      6-204267      7/1994

* cited by examiner

Primary Examiner—John F. Niebling
Assistant Examiner—Stacey Whitmore
(74) Attorney, Agent, or Firm—Leydig, Voit & Mayer, Ltd.

(57) ABSTRACT

A method of producing semiconductor devices includes bonding one side of an expandable resin wafer sheet with thermosetting adhesive layers on both sides to a back side of a semiconductor wafer, and dividing the semiconductor wafer into semiconductor elements by dicing to form separation grooves; expanding the wafer sheet, widening the separation grooves between the semiconductor elements; positioning one of the semiconductor elements on a die pad of a lead frame to be die-bonded; cutting the wafer sheet opposite the expanded separation grooves surrounding the semiconductor element which has been positioned on the die pad, separating a piece of the wafer sheet with a semiconductor element on the piece of the wafer sheet, and pressing the adhesive surface on the side of the piece of the wafer sheet opposite the semiconductor element onto a surface of the die pad.

2 Claims, 8 Drawing Sheets

Fig. 10B

METHOD OF PRODUCING SEMICONDUCTOR DEVICES

BACKGROUND OF THE INVENTION

1. Field of the Invention

The present invention relates to a wafer sheet, a method of producing a semiconductor device using the wafer sheet, and an apparatus for producing a semiconductor device. More particularly, it relates to a semiconductor wafer laminated on its back side to a wafer sheet which is covered by thermosetting adhesive layers on both sides while element separation and die bonding operations are carried out substantially simultaneously, thereby improving the productivity, a method of producing a semiconductor device using the wafer sheet, and an apparatus for producing a semiconductor device.

2. Description of the Related Art

Steps for producing semiconductor devices include a bonding step. The bonding step comprises a die bonding step where each of semiconductor elements (dice) which have been separated from a wafer is bonded onto a die pad and a wire bonding step where electrodes on the semiconductor element 3 and inner leads are electrically connected with each other by means of thin metal wires.

As the wire bonding operation, among the operations in the bonding step, has been increasingly automated, it has become relatively more important to rationalize the feeding of semiconductor elements around a die bonder. As a result, various methods of feeding the semiconductor elements, such as a direct pickup system, have recently been devised by manufacturers and have been disseminating.

Figure 10A:
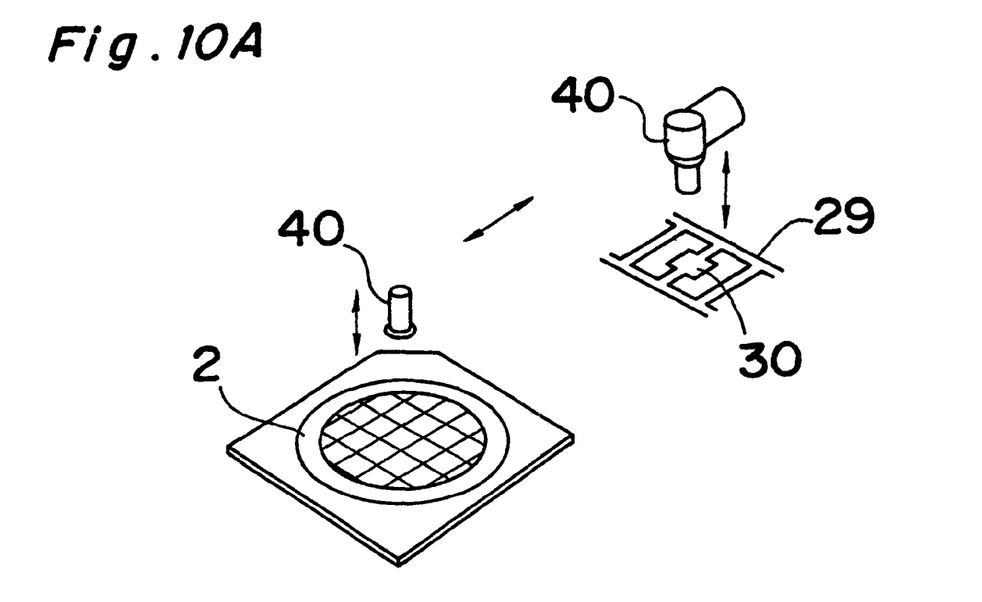
FIGS. 10A and 10B are perspective views schematically showing the die bonding apparatus of the direct pick-up system of the prior art.
Figure 10B:
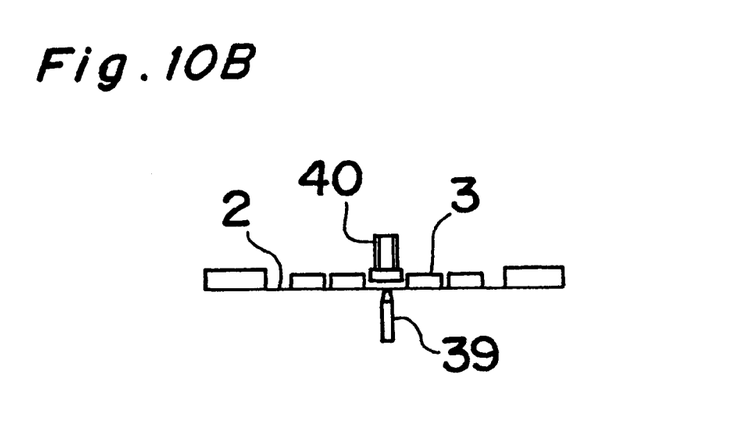

FIGS. 10A, 10B are schematic diagrams showing a die bonding apparatus with the direct pickup system of the prior art, where FIG. 10A is a perspective view and FIG. 10B is a cross sectional view of a key portion.

As shown in the drawing, while locating the semiconductor element 3 attached to the wafer sheet 2, only good elements are thrust up by a thrust pin 38, picked up by a suction head 39, moved onto a die pad 30 of a lead frame 29 and bonded thereon. Good elements may be identified either by using an ink mark provided on the surface of a defective element or by means of a map of good elements stored on a floppy disk (not shown and hereinafter referred to as F/D) which provides the information on the positions of good elements.

However, either of the methods described above has such problems that, since the selected elements are thrust up by the thrust pin 38, picked up by the suction head 39, moved onto the die pad 30 which is located at a distance and bonded thereon, there is a possibility that the semiconductor element 3 is damaged during thrusting, picking up or die bonding, and the throughput decreases due to longer time required for the bonding step as a whole. In an attempt to solve the problems of the prior art, for example, Japanese Patent Laid-Open Publication No. Hei. 6-204267 discloses a semiconductor wafer having an adhesive tape attached on the front side and is diced on the back side each. of the separated semiconductor elements is bonded on the back side to a element mounting position of a lead frame by pressing on the front surface of the semiconductor element via the adhesive tape using a die bonding fixture, and the adhesive tape is removed and the semiconductor element is bonded on the back side to the element mounting position in a single step.

However, with the die bonding step described above, although the adhesive tape is attached to the front surface of the semiconductor wafer, possibility of damaging the integrated circuit due to mechanical impact cannot be eliminated because the front surface of the semiconductor element the integrated circuit is formed is pressed via the adhesive tape by the die bonding fixture. Further, since the adhesive tape is attached to the front surface of the semiconductor wafer, an adhesive material sticks onto the surface of electrodes provided on the front surface of the wafer thereby causing contamination and, wire bonding of thin metal wires thereon without cleaning may result in poor reliability of connection. To solve this problem, it is required to introduce a new process of cleaning the electrode surface.

SUMMARY OF THE INVENTION

The present invention has been attained to solve the problems of the die bonding method of the prior art as described above, and an object of the present invention is to provide a wafer sheet surely carrying out die bonding with fewer steps without causing damage to the semiconductor elements, thereby improving productivity, a method of producing a semiconductor device using the wafer sheet, and a semiconductor producing apparatus.

The wafer sheet according to the present invention comprises an expandable resin sheet with thermosetting adhesive layers formed on both sides and a semiconductor wafer attached to the back side thereof before dicing.

The present invention also provides a wafer sheet wherein the expandable resin sheet is made of soft vinyl chloride. Further the present invention provides a wafer sheet wherein the expandable resin sheet is made of a polyimide-modified epoxy resin containing 40% by weight of a silver filler.

Further the present invention provides a wafer sheet wherein the expandable resin sheet is made of an electrically conductive sheet with electrically conductive thermosetting adhesive layers formed on both sides thereof.

The present invention also provides a wafer sheet wherein the expandable resin sheet has multitude of through holes.

The method of producing the semiconductor devices according to the present invention comprises the steps of bonding one side of the wafer sheet made from the expandable resin sheet with thermosetting adhesive layers formed on both sides thereof laminated onto the back side of the semiconductor wafer, and dividing the semiconductor wafer into a plurality of semiconductor elements by dicing; expanding the wafer sheet which carries the separated semiconductor elements being laminated thereon, thereby widening the separation grooves between the semiconductor elements; positioning proper one among the semiconductor elements on a die pad of a lead frame whereon the element is to be die-bonded while being separated from each other; and cutting off the wafer sheet below the expanded separation grooves surrounding the semiconductor elements which have been positioned on the die pads thereby separating the piece of wafer sheet with the semiconductor element laminated thereon, and pressing the adhesive surface on the side of the wafer sheet, opposite to that where the semiconductor element is attached, onto the die pad surface.

The present invention also provides a method wherein the separated semiconductor element is pressed by means of compressed air thereby pressing the adhesive surface on the side of the wafer sheet opposite to that where the semiconductor element is attached onto the die pad surface.

The semiconductor device producing apparatus of the present invention comprises a stage whereon a wafer sheet carrier, which holds the wafer sheet with the semiconductor elements laminated thereon while being separated from each other, is placed at a distance from the lead frame; a die bonding means which is disposed at a die bonding position of the stage to be capable of moving vertically and has a hollow space to cover the semiconductor element while keeping a specified clearance during die bonding, a die bonding head having a compressed air passage opening at the bottom of the hollow space and a cutting blade for cutting off the wafer sheet below the expanded separation grooves between the semiconductor elements provided at the tip of the die bonding head and a drive section for driving the die bonding head; and a compressed air supplying means for supplying compressed air into the compressed air passage during die bonding of the semiconductor element.

The present invention also provides a semiconductor device producing apparatus wherein the cutting blade is disposed to be inserted through the expanded separation grooves with a specified clearance kept from the side faces of the grooves surrounding the semiconductor element to be die-bonded, in such a way that the cutting blade can be attached to the tip of the die bonding head and removed therefrom.

The present invention also provides a semiconductor device producing apparatus provided with X-/Y-axis direction drive means for moving the stage in X- and Y-axis directions thereby to move a proper element among the semiconductor elements, which have been separated from each other, onto a die pad of the lead frame whereon the element is to be die-bonded and setting the element thereon, and element rotating means for rotating the wafer sheet carrier placed on the stage thereby to adjust the inclination angle of the semiconductor element at the setting position thereof.

Also according to the present invention, the semiconductor device producing apparatus has the compressed air passage of the die bonding head disposed on the vertical line passing through the center of the semiconductor element to be die-bonded, a semiconductor layer disposed on the die bonding head to emit a light beam in the vertical direction toward the semiconductor element surface, a element position detecting means for locating the point on the semiconductor element surface which is irradiated by the laser beam emitted by the semiconductor laser and generating a position signal to indicate deviation of the semiconductor element from the normal position in the X-axis and Y-axis directions with zero position being set at the laser spot and the information on the inclination angle from the normal direction, and a die bonding controller which, upon receipt of the position signal from the element position detecting means, sends correction signals for the displacement or inclination angle to the X-/Y-axis direction drive means or the element rotating means and, when the position of the semiconductor element is corrected, sends an operation command signal to the die bonding means and the compressed air supplying means to start the specified operations.

The present invention, having the constitution described above, has such effects as described below.

Since the wafer sheet is made from the expandable resin sheet with thermosetting adhesive layers formed on both sides thereof, the semiconductor elements laminated on the wafer sheet can be separated into individual elements and die-bonded substantially at the same time during dicing.

By using the soft vinyl chloride for the expandable resin sheet, low-cost wafer sheet can be obtained.

By using the expandable resin sheet made of a polyimide-modified epoxy resin containing 40% by weight of a silver filler, the wafer sheet having good heat conductivity can be obtained without significantly affecting the stretching capability.

Since both the expandable resin sheet and the thermosetting adhesive layers formed on both sides thereof are made of electrically conductive materials, the wafer sheet is capable of accommodating the semiconductor element which requires it to make the potential of the back surface of the semiconductor element equal to the ground level.

Since the expandable resin sheet has multitude of through holes, the resin sheet is capable of stretching more, and therefore wider expanded separation groove can be obtained during expansion of the wafer sheet, thus making it possible to insert the cutting blade of the die bonding head into the expanded separation groove with a greater margin and making it easier to separate the semiconductor elements into individual devices.

Further, since the back side of the semiconductor wafer element is laminated onto one of the adhesive layers of the wafer sheet and, after expanding the separation grooves made by dicing, the wafer sheet below the expanded separation groove is cut off thereby separating the semiconductor elements into individual devices while the semiconductor element is pressurized to have the other adhesive surface of the wafer sheet laminated onto the die pad surface, the semiconductor element can be die-bonded with less number of steps and the productivity is improved.

Also since the semiconductor element is pressed by compressed air during die bonding, there is no possibility of causing mechanical damage to the semiconductor element.

Further, since the semiconductor device producing apparatus is made in a compact configuration comprising the stage whereon the wafer sheet is placed, the die bonding means having the compressed air passage, the cutting blade which cuts off the wafer sheet below the expanded separation groove between the semiconductor elements and the compressed air supplying means which supplies compressed air to the compressed air passage, the compact semiconductor device producing apparatus can be provided at a low cost wherein separation of the semiconductor elements into individual devices and die bonding operation can be carried out substantially at the same place and substantially at the same time.

Also since the cutting blade which cuts off the wafer sheet below the expanded separation groove is made in a size corresponding to the size of the semiconductor device to be die-bonded is provided to be attached to and detached from the bonding head, different kinds of the semiconductor device can be accommodated very easily and quickly.

Further, since the X-/Y-axis direction drive means of the stage whereon the wafer sheet carrier is placed and the element rotating means are provided, displacement and inclination of the semiconductor element to be die-bonded can be easily corrected.

Also since the semiconductor producing apparatus is made in such a configuration that is provided with the element position detecting means which issues the position signal representing the displacement and inclination in the setting position of the semiconductor element to be die-bonded, and the die bonding controller which issues the correction signal based on the position signal to control the X-/Y-axis direction drive means and the element rotating means of the stage whereon the wafer sheet carrier is placed, the semiconductor element remaining on the wafer sheet can be easily moved to the normal bonding position by correcting the displacement and inclination.

DESCRIPTION OF THE PREFERRED EMBODIMENTS

Embodiment 1

Now a first embodiment of the present invention will be described below with reference to the accompanying drawings.

FIGS. 1A through 1F show the producing steps up to the die bonding step in the order of carrying out the first embodiment of the present invention, wherein the steps are as follows.

Figure 1A:
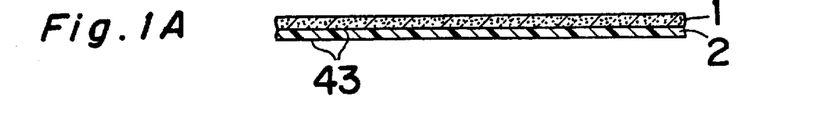
FIGS. 1A–1F are schematic diagrams showing a flow sheet up to a die bonding step in the order of carrying out the first embodiment of the present invention.

(A) Wafer sheet attaching step (FIG. 1A)

A semiconductor wafer 1 is attached on the back side thereof to one side of a wafer sheet 2 comprising a tape made of soft vinyl chloride having a thickness of 80 to 120 μm with thermosetting adhesive layers 43 on both sides thereof. The soft vinyl chloride tape is a low-cost material capable of stretching substantially and is suited for the expansion step. A wafer test is conducted to determine whether the integrated circuit on the semiconductor wafer 1 is normally functional or not, with the result being stored in the form of a map of good elements on an F/D (not shown).

Figure 1B:
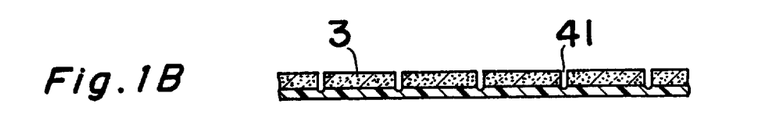

(B) Wafer dicing step (FIG. 1B)

Separation grooves 41 are formed along borders of the individual elements by means of a dicing saw thereby cutting the semiconductor wafer 1 into individual semiconductor elements 3 while leaving the wafer sheet 2 intact.

Figure 1C:
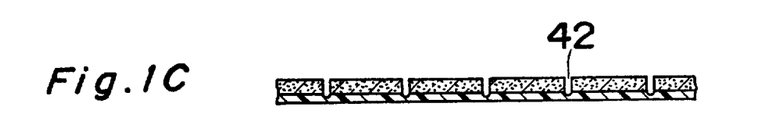

(C) Expansion step (FIG. 1C)

The wafer sheet 2 is stretched and held on a support ring (not shown) by means of a band to prepare a wafer sheet carrier (both not shown). Thus the separation grooves 41 between the semiconductor elements 3 are expanded to about 1.5 to 2.0 mm, for example, into expanded separation grooves 42.

Figure 1D:
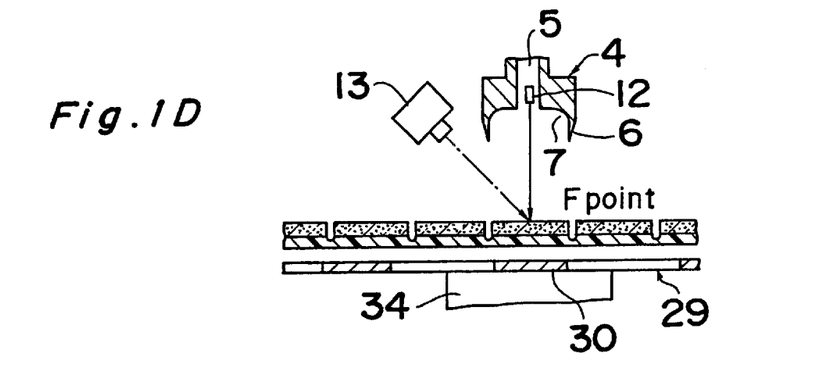

(D) Positioning step (FIG. 1D)

The wafer sheet carrier is set on the stage of a movable base (both not shown) of the die bonding apparatus, whereon with the distance between the wafer sheet 2 and the lead frame 29 is about 2 to 3 mm, for example, the semiconductor elements 3 to be die-bonded are positioned on the die pads 30 while being separated from each other, using a semiconductor laser 12, a CCD camera 13, the X-/Y-axis direction drive means and an element rotating means (both not shown). The die pads 30 are pre-heated to a temperature from 50 to 80° C. by means of a heat block 34 disposed below.

Figure 1E:
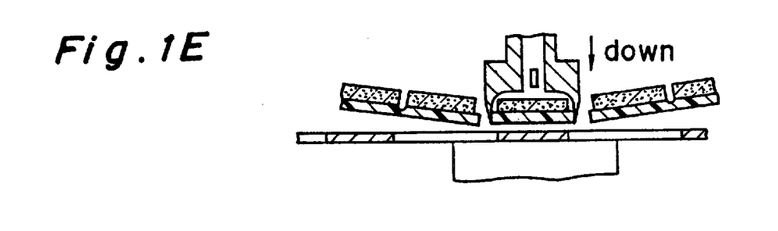

(E) Separation step (FIG. 1E)

A die bonding head 4 is lowered to cover the semiconductor element 3 in a hollow space 7 thereof, and a cutting blade 6 mounted on the tip of the die bonding head is inserted into the expanded separation grooves 42 between the separated semiconductor elements 3 thereby cutting the wafer sheet 2 and separating the individual semiconductor elements 3. In this process, the inner surface of the hollow space 7 does not make contact with the semiconductor element 3 at all and the edge of the cutting blade 6 does not reach the lead frame 29.

Figure 1F:
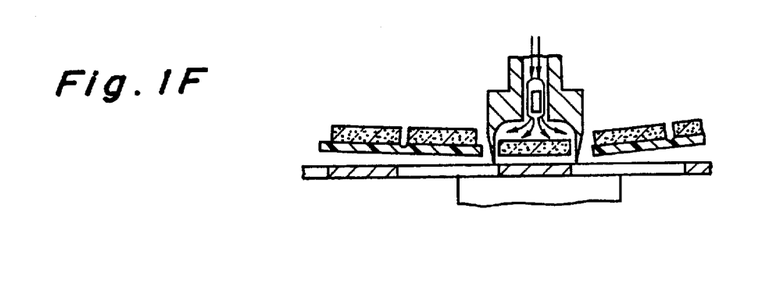

(F) Die bonding step (FIG. 1F)

Compressed air is let out of the compressed air passage 5 of the die bonding head 4 substantially at the same time the semiconductor elements 3 to be die-bonded are separated into individual elements, thereby to press the surface of the semiconductor element 3 so that the adhesive surface of the wafer sheet on the side opposite to that of the semiconductor element is laminated onto the die pad 30. Then the heat block 34 is heated to a temperature from 150 to 250° C., for example, thereby to heat and harden the thermosetting adhesive layer 43. Arrow marks in and outside the compressed air passage 5 indicate the directions of compressed air flow.

As described above, since the operations of separating the semiconductor elements and die bonding are carried out substantially at the same time and reliably, the number of steps required before the die bonding step is reduced and the productivity is improved.

Also because the semiconductor elements 3 are separated into individual elements by cutting off the wafer sheet 2 while being separated from the lead frame 29 and the semiconductor element 3 is die-bonded onto the die pad 30 by applying pressure by means of compressed air, mechanical force is not applied to the semiconductor elements 3 thus eliminating the possibility of causing damage thereto. Also the cutting blade 6 never cuts the lead frame 29.

Figure 2:
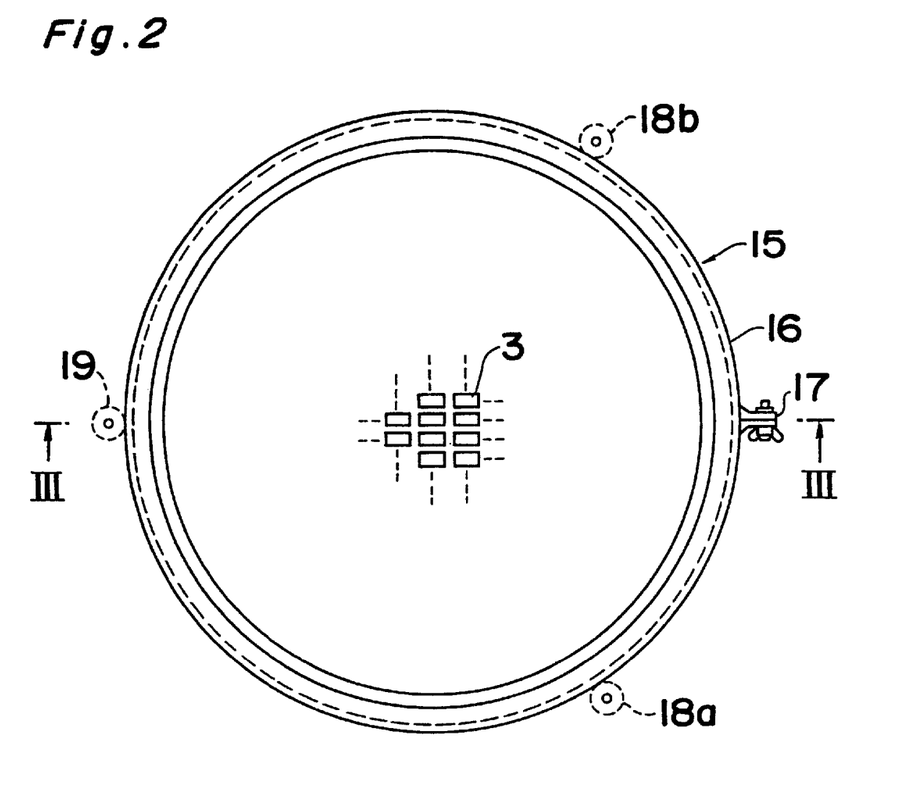
FIG. 2 is a plan view showing a wafer sheet carrier made in the expansion step according to the first embodiment of the present invention.
Figure 3:
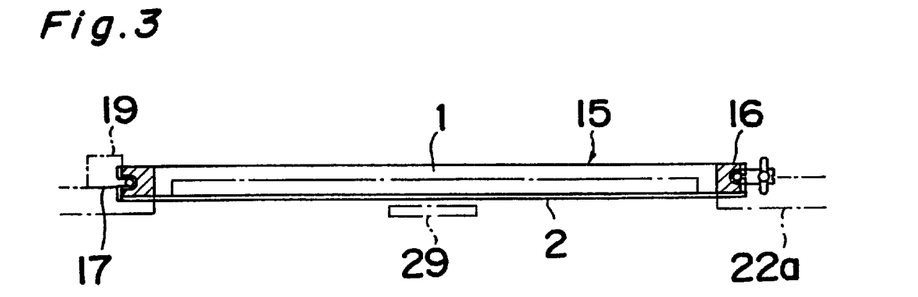
FIG. 3 is a cross sectional view taken along line III—III of FIG. 2.

FIG. 2 is a plan view showing the wafer sheet carrier made in the expansion step, and FIG. 3 is a cross sectional view taken along lines III—III. As can be seen in the drawing, the wafer sheet carrier 15 has a configuration so that the wafer sheet 2 with the separated semiconductor elements 3 bonded thereto is stretched toward the outside of the support ring 16 and is secured in a groove made in an outer side face of the support ring 16 by means of the band 17. The wafer sheet carrier is set on the stage 22a of the movable base of the die bonding apparatus in such a positional relationship with fixed rollers 18a, 18b, a movable roller 19 and the lead frame 29 as shown in FIGS. 2 and 3, so that the following steps (positioning step, separation step and die bonding step) are carried out with this setup.

Now the configuration of the die bonding apparatus which carries out the steps (A) through (F) will be described below.

Figure 4:
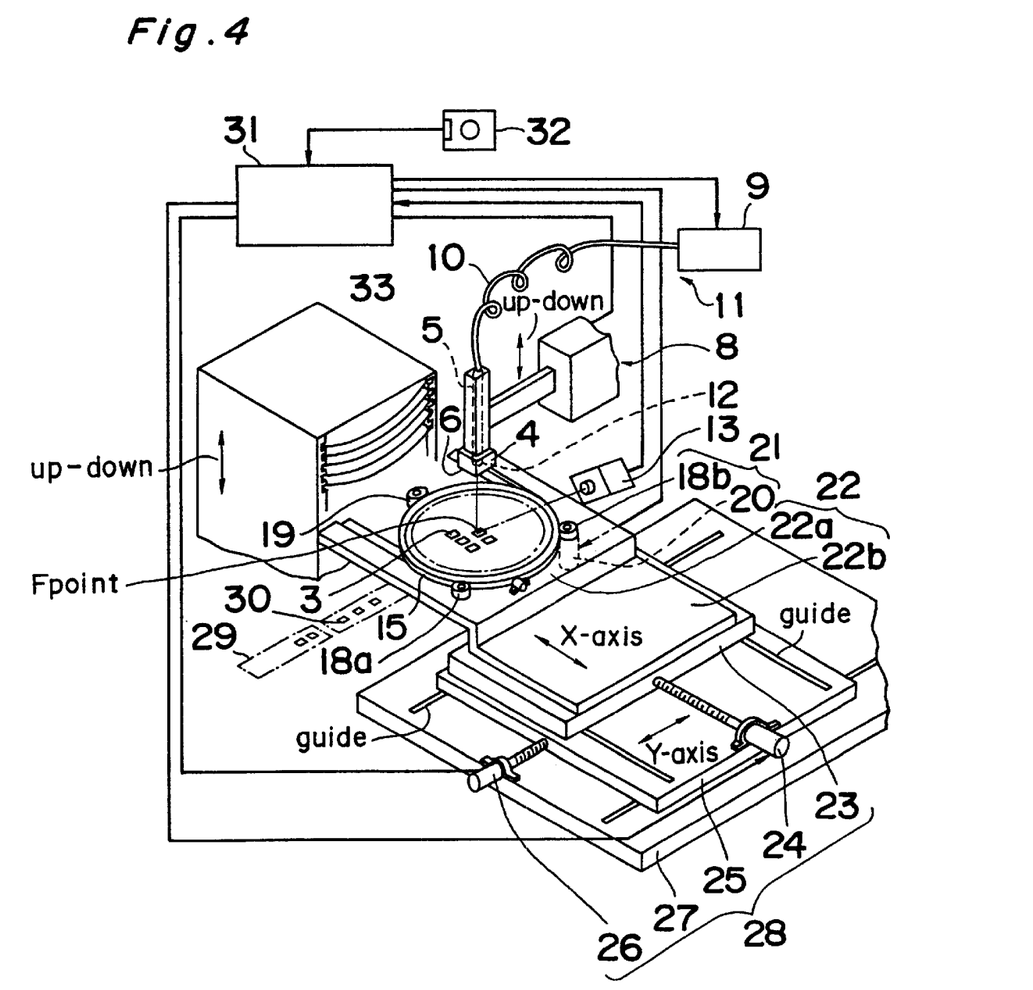
FIG. 4 is a perspective view schematically showing the configuration of the die bonding apparatus according to the first embodiment of the present invention.

FIG. 4 is a perspective view schematically showing the configuration of the die bonding apparatus according to the present invention. As can be seen in the drawing, the movable base 22 which has the stage 22a whereon the wafer sheet carrier 15 is placed has a fixed portion 22b which is fixed on a Y-axis motion table 23 which can move in the Y-axis direction, The Y-axis motion table 23 is disposed to be movable on a guide of an X-axis motion table 25 which can move in the X-axis direction and the X-axis motion table 25 is disposed to be movable on a guide of a fixed base 27. The movable base 22 and the Y-axis motion table 23 are made movable in the Y-axis direction by means of a Y-axis drive motor 24 equipped with a ball screw mounted on the X-axis motion table 25, and the X-axis motion table 25 is made movable in the X-axis direction by means of an X-axis drive motor 26 equipped with a ball screw mounted on the fixed base 27. The Y-axis motion table 23, the Y-axis drive motor 24, the X-axis motion table 25, X-axis drive motor 26 and the fixed base 27 constitute the X-/Y-axis direction drive means 28, which moves the semiconductor element 3 to the die bonding position. The stage 22a of the movable base 22 has the fixed rollers 18a, 18b and the movable roller 19 made of Teflon disposed at angular intervals of 120 degrees for positioning the wafer sheet carrier 15 to be placed thereon into a specified position and rotating the wafer sheet carrier 15, so that the periphery of the wafer sheet carrier 15 is rotated by a roller drive motor 20 linked to the fixed roller 18b. When the wafer sheet carrier 15 is fed from a wafer sheet carrier housing case 33 onto the stage 22a, the movable roller 19 temporarily retracts to a safe position to give way for the feeding operation and, after feeding, returns to the normal position to make contact with the periphery of the wafer sheet carrier 15 while pressing lightly thereto (not shown). Applied to a position of the stage 22a is a coating of Teflon so that the adhesive material of the wafer sheet 2 does not impede the rotation. The fixed rollers 18a, 18b, the movable roller 19 and the roller drive motor 20 constitute the element rotating means, 21, which rotates the wafer sheet carrier 15 thereby to correct the inclination of the semiconductor element 3.

Disposed above the die bonding position of the wafer sheet carrier 15 is the die bonding head 4 which moves in the vertical direction as shown in FIG. 1, The die bonding head 4 has the hollow space 7 (not shown in FIG. 4) which covers the semiconductor element 3 to be die-bonded with a specified clearance and the compressed air passage 5 which opens at the bottom of the hollow space 7, and the cutting blade 6 mounted at the tip thereof to cut the wafer sheet 2 along the expanded separation grooves 42 which surround the semiconductor element 3 to be die-bonded, The die bonding head 4 is moved vertically by a drive element (not shown). The compressed air passage 5 and the compressed air generator 9 are connected by a flexible tube 10 for supplying compressed air during die bonding. The die bonding head 4 and the drive element constitute the die bonding means 8, while the compressed air generator 9 and the flexible tube 10 constitute the compressed air supplying means 11. Once the semiconductor element 3 to be die-bonded is set at the die bonding position in accordance to the position information of good elements stored on the F/D 32, the semiconductor laser 12 operates to direct a laser beam to a point F on the surface of the semiconductor element 3. The laser beam spot is captured by the CCD camera 13, so that position signal of the semiconductor element 3 with reference to the laser spot F is sent from the CCD camera 13 to the die bonding controller 31. The semiconductor laser 12 and the CCD camera 13 constitute the element position detecting means. The die bonding controller 31 determines whether the semiconductor element 3 is set at the correct position according to the position signal which has been received. When the position is not correct, the die bonding controller 31 sends correction signal to the roller drive motor 20, the Y-axis drive motor 24 or the X-axis drive motor 26 thereby to correct the setting position of the semiconductor element 3, then sends the operation command signal to the compressed air supplying means 11 thereby to carry out the die bonding operation. Inward and outward arrows to and from the die bonding controller 31 indicate the directions of information flow.

Now the die bonding method with the die bonding apparatus will be described in detail below.

Figure 5:
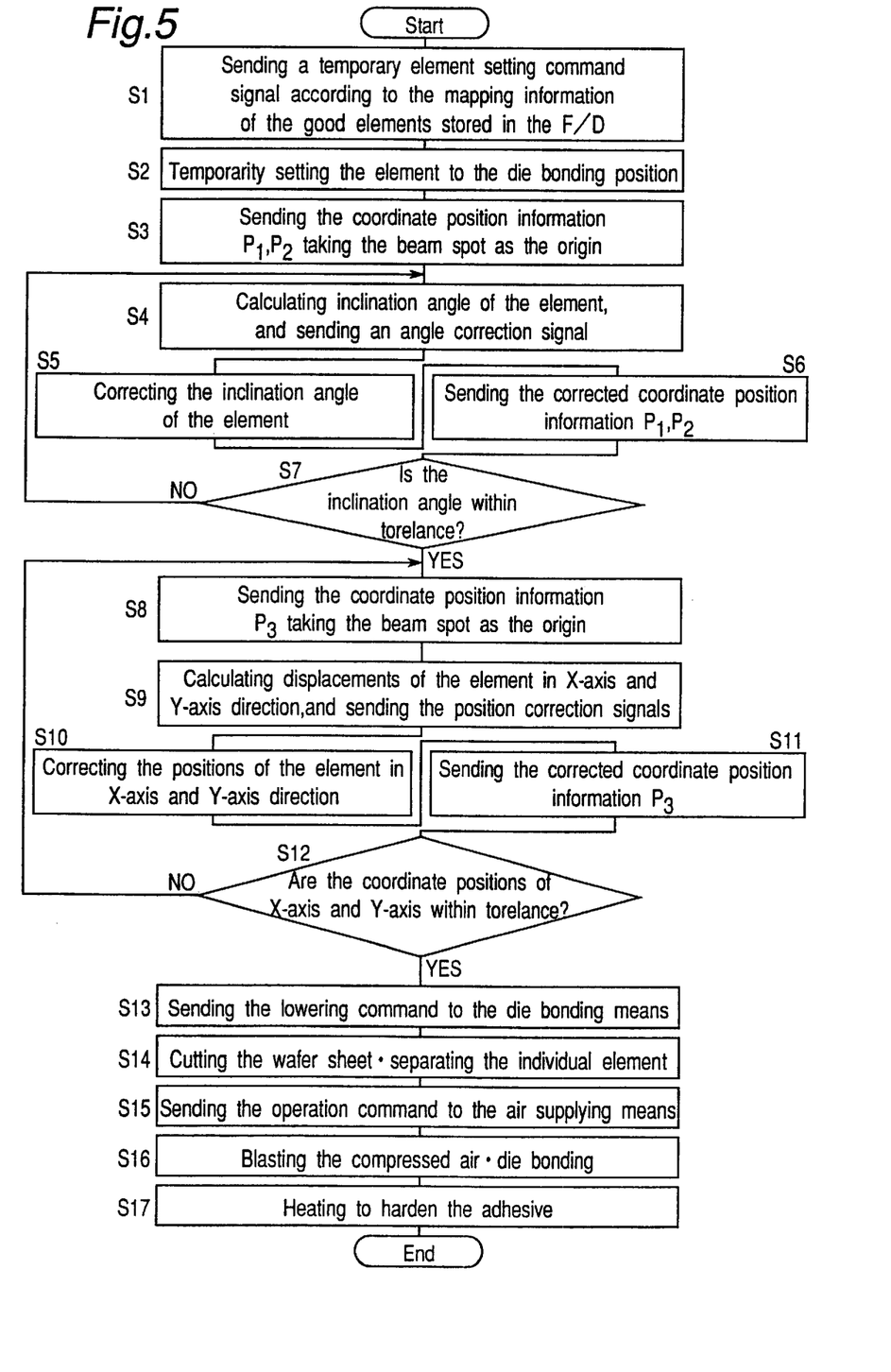
FIG. 5 is a flow chart showing the order of operations of the die bonding apparatus according to the first embodiment of the present invention.
Figure 6A:
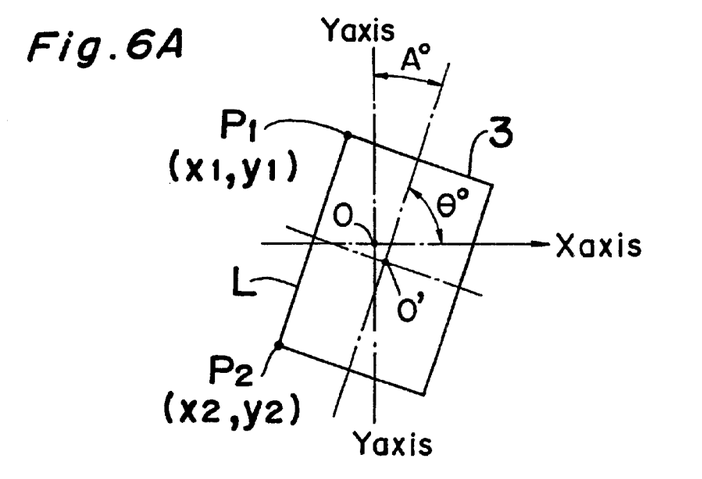
FIGS. 6A–6C are schematic diagrams showing the procedures of operations to correct improper position of the semiconductor element to be die-bonded on the die bonding apparatus according to the first embodiment of the present invention.
Figure 6B:
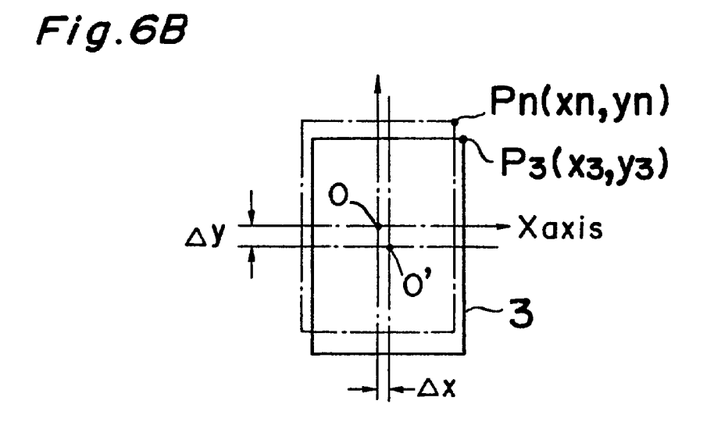
Figure 6C:
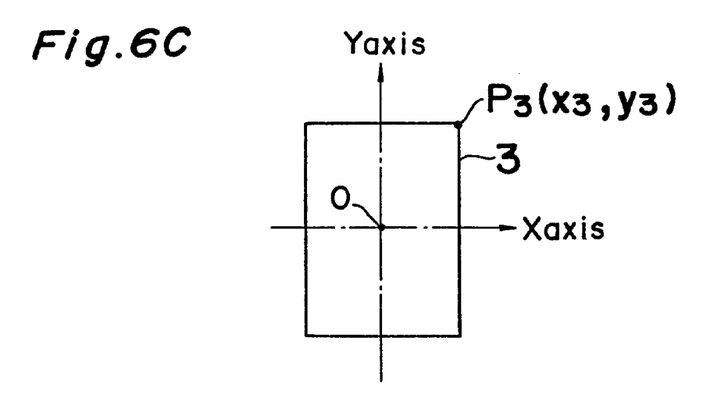

FIG. 5 is a flow chart showing the procedure of the operations of the die bonding apparatus, and FIG. 6 shows the procedure of correcting improper position of the semiconductor element to be die bonded.

First, the die bonding controller 31 sends a temporary element setting command signal for moving the wafer sheet carrier 15 in the X-axis and Y-axis directions in order to set the semiconductor element 3 to be die-bonded at the die bonding position according to the mapping information of the good elements stored in the F/D 32 (S1). Upon receipt of the temporary element setting command signal, the Y-axis drive motor 24 and the X-axis drive motor 26 move the Y-axis motion table 23 and the X-axis motion table 25 according to the temporary element setting command signal, thereby to temporarily set the semiconductor element 3 supported by the wafer sheet carrier 15 placed on the stage 22a of the movable base 22 to the die bonding position (S2). This causes the semiconductor laser 12 to direct the laser beam to the center of the die bonding position thereby to irradiate the point F on the surface of the semiconductor element 3. The CCD camera 13 captures the image of the beam spot at the point F and sends coordinate position information $P_1$ ($x_1$, $y_1$) and $P_2$ ($x_2$, $y_2$) of two corners, which take the point F as the origin, to the die bonding controller 31 (S3, FIG. 6A). The die bonding controller 31 calculates, from the coordinate position information $P_1$ ($x_1$, $y_1$) and $P_2$ ($x_2$, $y_2$), gradient M of an edge L of the semiconductor element 3 by equation (1), inclination angle Θ with respect to the X axis by equation (2) and inclination angle A with respect to the Y axis by equation (3), and sends an angle correction signal to the roller drive motor 20 to make it rotate the wafer sheet carrier 15 by the angle A counterclockwise in the case of a positive gradient or clockwise in the case of a negative gradient (S4).

$$M=(y_1-y_2)/(x_1-x_2) \tag{1}$$

$$\Theta=\tan^{-1}|(y_1-y_2)/(x_1-x_2)| \tag{2}$$

$$A=90-\Theta \tag{3}$$

Upon receipt of the angle correction signal, the roller drive motor 20 rotates the wafer sheet carrier 15 by the angle A in the specified direction via the fixed roller 18b according to the signal, thereby to correct the inclination of the semiconductor element 3 (S5). Then the CCD camera 13 captures the coordinate position information $P_1$ ($x_1$, $y_1$) and $P_2$ ($x_2$, $y_2$) of two corners which have been corrected similarly to that described above and sends them to the die bonding controller 31 (S6). The die bonding controller 31 determines whether the inclination angle A of the semiconductor element 3 with respect to the Y-axis is within tolerance or not based on the coordinate position information $P_1$ ($x_1$, $y_1$) and $P_2$ ($x_2$, $y_2$) which have been received. When it is out of the tolerance a, similar correcting operation is repeated, and the step proceeds to the next step when it is within the tolerance (S7).

Then the CCD camera 13 captures coordinate position information $P_3$ ($x_3$, $y_3$) of a corner taking reference to the point F as the origin and sends the signal to the die bonding controller 31 (S8, FIG. 6B). The die bonding controller 31 compares the coordinate position information $P_3$ ($x_3$, $y_3$) and correct coordinates $P_n$ ($x_n$, $y_n$) stored in memory, calculates displacements of the semiconductor element 3 in X-axis and Y-axis directions by equations (4) and (5), and sends position correction signals to the Y-axis drive motor 24 and the X-axis drive motor 26 (S9).

$$\Delta x = x_n - x_3 \quad (4)$$

$$\Delta y = y_n - y_3 \quad (5)$$

Upon receipt of the position correction signal, the Y-axis drive motor 24 and the X-axis drive motor 26 move the Y-axis motion table 23 and the X-axis motion table 25 by Δx and Δy thereby to correct the displacement of the semiconductor element 3 (S10, FIG. 6C). Then the CCD camera 13 captures the corrected coordinate position information $P_3$ ($x_3$, $y_3$) of the corner and sends the signal to the die bonding controller 31 (S11).

The die bonding controller 31 determines whether the displacements of the semiconductor element 3 in X-axis and Y-axis directions are within tolerance or not based on the coordinate position information $P_3$ ($x_3$, $y_3$) which have been received. When it is out of the tolerance, a correcting operation similar to that described above is repeated, and the step proceeds to the next step when it is within the tolerance (S12).

Then the die bonding controller 31 issues the operation command signal to the die bonding means 8 (S13). The die bonding means lowers the bonding head 4 to a specified position according to the command signal, so that the cutting blade 6 disposed at the tip thereof cuts the wafer sheet 2 in the expanded separation groove 42 surrounding the semiconductor element 3 thereby separating the individual elements (S14). Substantially at the same time, the die bonding controller 31 issues the operation command signal to the compressed air supplying means 11 (S15). Compressed air is blasted through the flexible tube 10 and the compressed air passage 5 into the hollow space 7 of the bonding head 4, so that the semiconductor element 3 is pressed by the compressed air and the adhesive surface of the wafer sheet 2 on the side opposite to that of the semiconductor element 3 and adheres the die pad 30 thus to be die-bonded (S16). As the die pad 30 is heated by the heat block 34, the thermosetting adhesive layer 43 is heated to harden, thereby completing the die bonding operation (S17).

Although the wafer sheet 2 is made by using soft vinyl chloride as the base material in the first embodiment, the wafer sheet may also be made of, for example, a polyimide-modified epoxy resin containing 40% by weight of a silver filler having a thickness of 80 to 120 μm, in order to improve the heat conductivity between the semiconductor element 3 and the die pad 30. In this case, a sheet having good heat conductivity can be obtained while maintaining sufficient elasticity. Also the sheet may be made capable of stretching more by including a multitude of through holes 36 having diameter of 0.2 mm at intervals of 0.3 to 0.5 mm therein as shown in FIG. 7 of the second embodiment.

Embodiment 2

Figure 7:
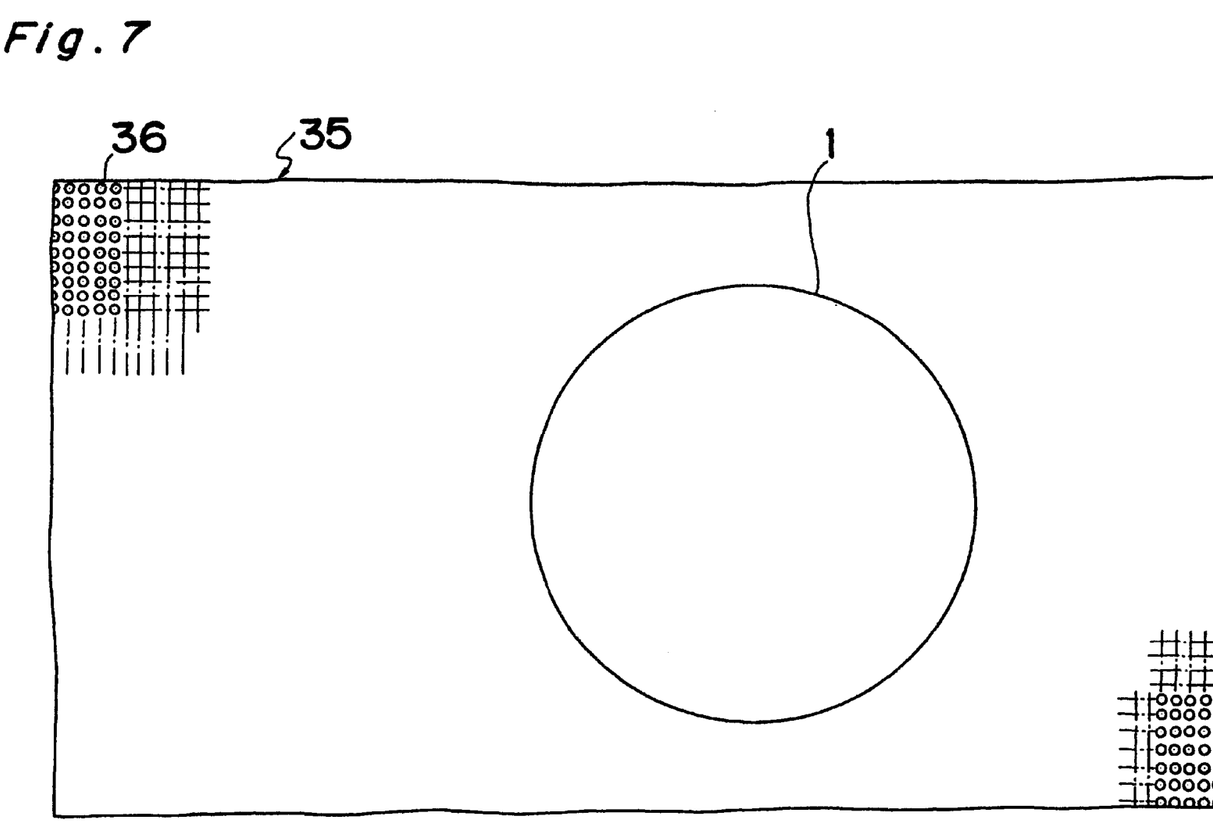
FIG. 7 is a plan view showing the perforated wafer sheet according to the second embodiment of the present invention.

FIG. 7 is a plan view of a perforated wafer sheet according to the second embodiment of the present invention. The perforated wafer sheet 35 is made of a polyimide-modified epoxy resin containing at least 80% by weight of a silver filler to make it electrically conductive and is formed into a film having a thickness of 80 to 120 μm, with a multitude of through holes 36 having a diameter of, for example, 0.2 mm made therein at intervals of 0.3 to 0.5 mm to make it capable-of stretching more, and is covered on both sides thereof by electrically conductive thermosetting resin adhesive layers 43 containing 70% by weight of a silver filler. The content of the silver filler is set in consideration of facts that a resin sheet shows sufficient electrical conductivity with a silver filler content of about 80% by weight, and a resin paste shows sufficient electrical conductivity with a silver filler content of about 70% by weight.

The die bonding step with the perforated wafer sheet 35 is exactly the same as that of the first embodiment.

Making the perforated wafer sheet 35 electrically conductive results in such effects as the operation of die-bonding the semiconductor element when the potential of the back surface of the semiconductor element must be equal to the ground level with higher reliability with fewer steps, thereby improving the productivity.

Embodiment 3

Figure 8:
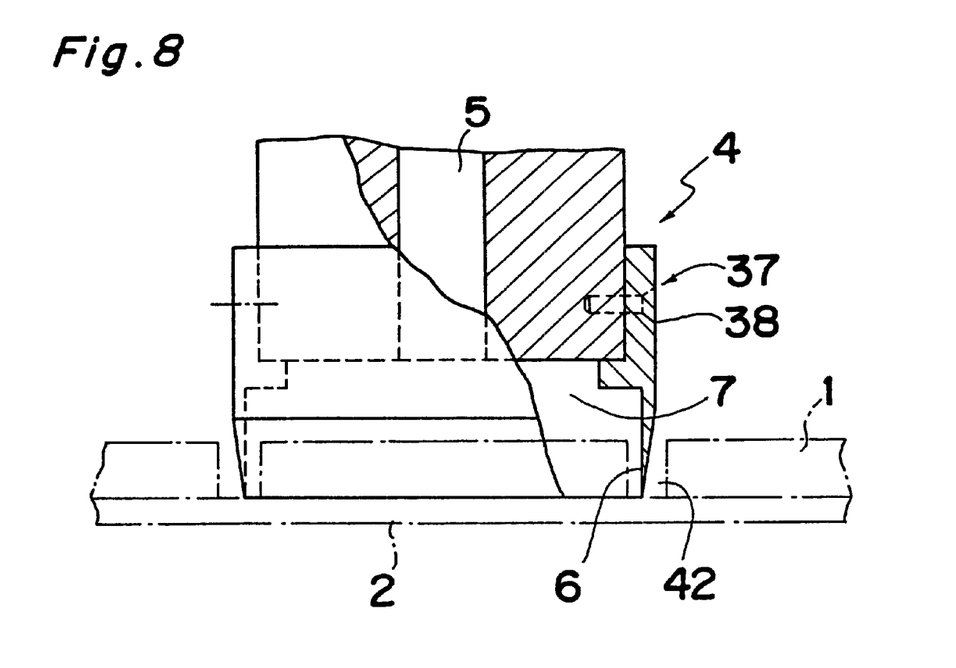
FIG. 8 is a partially cutaway side view showing the configuration of the die bonding head of the die bonding apparatus according to the third embodiment of the present invention.
Figure 9:
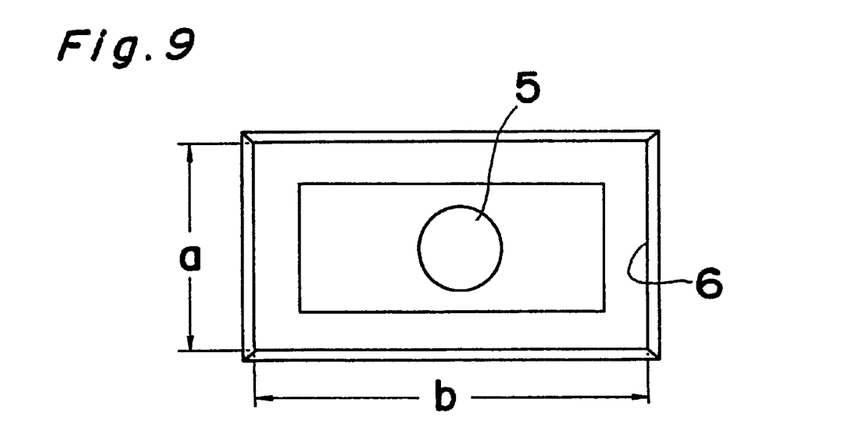
FIG. 9 is a bottom view of FIG. 8.

FIGS. 8 and 9 show the configuration of the die bonding head of the die bonding apparatus according to the third embodiment of the present invention, FIG. 8 being a partially cutaway side view and FIG. 9 being a bottom view of FIG. 8. As shown in the drawing, a blade attachment 37 having the cutting blade 6 is attached to the tip of the bonding head 4 by means of set screws 38, the cutting blade 6 being formed in such a configuration as can be inserted into the expanded separation groove 42 of the semiconductor element 3 to be die-bonded with a specified clearance. Since the blade attachment 37 having the cutting blade 6 corresponding to the size of the semiconductor element 3 to be die-bonded is provided to be attached to and detached from the tip of the bonding head 4, different kinds of semiconductor elements can be accommodated very easily and quickly.

What is claimed is:

1. A method of producing semiconductor devices comprising:

bonding one side of an expandable resin wafer sheet with thermosetting adhesive layers on both sides to a back side of a semiconductor wafer, and dividing the semiconductor wafer into a plurality of semiconductor elements by dicing to form separation grooves;

expanding the wafer sheet, thereby widening the separation grooves between the semiconductor elements;

positioning one of the semiconductor elements on a die pad of a lead frame to be die-bonded; and cutting the wafer sheet opposite the expanded separation grooves surrounding the semiconductor element which has been positioned on the die pad, thereby separating a piece of the wafer sheet with a semiconductor element thereon, and pressing the adhesive surface on the side of the piece of the wafer sheet opposite the semiconductor element onto a surface of the die pad.

2. The method according to claim 1, including pressing the adhesive surface on the side of the wafer sheet opposite the semiconductor element onto the die pad surface with compressed air.

* * * * *